(12) United States Patent
Kang et al.

(10) Patent No.: US 11,796,595 B2
(45) Date of Patent: Oct. 24, 2023

(54) APPARATUS AND METHOD FOR INSPECTING DEFECT OF SECONDARY BATTERY

(71) Applicant: LG CHEM, LTD., Seoul (KR)

(72) Inventors: Joon Sup Kang, Daejeon (KR); Sung Tae Kim, Daejeon (KR); Nak Gi Sung, Daejeon (KR); Joon Sung Bae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 329 days.

(21) Appl. No.: 16/476,787

(22) PCT Filed: Jul. 10, 2018

(86) PCT No.: PCT/KR2018/007823
§ 371 (c)(1),
(2) Date: Jul. 9, 2019

(87) PCT Pub. No.: WO2019/013534
PCT Pub. Date: Jan. 17, 2019

(65) Prior Publication Data
US 2019/0324089 A1 Oct. 24, 2019

(30) Foreign Application Priority Data

Jul. 11, 2017 (KR) .................. 10-2017-0087842
Jul. 9, 2018 (KR) .................. 10-2018-0079155

(51) Int. Cl.
*G01R 31/36* (2020.01)
*H01M 10/42* (2006.01)
*G01R 31/389* (2019.01)

(52) U.S. Cl.
CPC ....... *G01R 31/3644* (2013.01); *G01R 31/389* (2019.01); *H01M 10/4285* (2013.01)

(58) Field of Classification Search
CPC .. G01R 31/392; G01R 31/36; G01R 31/3865; G01R 31/389; G01R 31/378;
(Continued)

(56) References Cited

U.S. PATENT DOCUMENTS

2006/0230849 A1* 10/2006 Yabe .................. F16H 25/2209
74/89.23
2008/0186029 A1 8/2008 Nishino et al.
(Continued)

FOREIGN PATENT DOCUMENTS

CN 101242013 A 8/2008
CN 205177965 U 4/2016
(Continued)

OTHER PUBLICATIONS

Hee S L. "compression testing machine for secondary battery used in e.g. electrical vehicle, has servo motor which is provided in driver side to provide power source to shafts, and compression unit whoe lower portion is arraganed opposite to plate", Thomson Reuters, 2014KR-089553 (ILWON) (Year: 2014).*
(Continued)

*Primary Examiner* — Lee E Rodak
*Assistant Examiner* — Trung Q Nguyen
(74) *Attorney, Agent, or Firm* — Birch, Stewart, Kolasch & Birch, LLP

(57) ABSTRACT

An apparatus for inspecting defects of a secondary battery having a pair of pressing jigs which press an outer surface of an electrode or a pouch accommodating the electrode assembly in directions corresponding to each other and on which a plurality of protrusions protrude from pressing surfaces and a measurement unit measuring one or more of current, a voltage, and resistance of the electrode assembly when the electrode assembly is pressed by the plurality of protrusions of the pair of pressing jigs is provided.

14 Claims, 14 Drawing Sheets

(58) Field of Classification Search
CPC . Y02E 60/10; H01M 10/058; H01M 10/0587;
H01M 10/488; H01M 2/16; H01M 2/145;
H01M 10/4285
USPC .................................. 324/32–434, 444–450
See application file for complete search history.

(56) References Cited

U.S. PATENT DOCUMENTS

| | | | | |
|---|---|---|---|---|
| 2011/0250485 | A1* | 10/2011 | Tsukuda | H01M 50/148 |
| | | | | 429/153 |
| 2015/0008885 | A1* | 1/2015 | Yoshida | H02J 7/0021 |
| | | | | 320/134 |
| 2015/0020578 | A1* | 1/2015 | Kim | G01M 3/363 |
| | | | | 73/40 |
| 2015/0180076 | A1* | 6/2015 | Hasegawa | H01M 10/0585 |
| | | | | 29/593 |
| 2016/0308238 | A1* | 10/2016 | Ichihara | H01M 8/0273 |
| 2017/0207440 | A1* | 7/2017 | Hama | H01M 10/4235 |

FOREIGN PATENT DOCUMENTS

| | | | | |
|---|---|---|---|---|
| JP | 3364677 | B2 | 1/2003 | |
| JP | 2010-153275 | A | 7/2010 | |
| JP | 2015-179490 | A | 9/2015 | |
| KR | 10-2008-0074240 | A | 8/2008 | |
| KR | 10-1058388 | B1 | 8/2011 | |
| KR | 10-2013-0076119 | A | 7/2013 | |
| KR | 10-2014-0015647 | A | 2/2014 | |
| KR | 10-1359902 | B1 | 2/2014 | |
| KR | 2014-089553 | * | 7/2014 | ............ H01M 10/48 |
| KR | 10-1442687 | B1 | 9/2014 | |
| KR | 10-2015-0054372 | A | 5/2015 | |
| KR | 10-2015-0062387 | A | 6/2015 | |
| KR | 10-2016-0009701 | A | 1/2016 | |
| KR | 10-2016-0068244 | A | 6/2016 | |

OTHER PUBLICATIONS

International Search Report (PCT/ISA/210) issued in PCT/KR2018/007823, dated Oct. 12, 2018.

* cited by examiner

APPARATUS AND METHOD FOR INSPECTING DEFECT OF SECONDARY BATTERY

CROSS-REFERENCE TO RELATED APPLICATION

The present application claims the benefit of the priority of Korean Patent Application Nos. 10-2017-0087842, filed on Jul. 11, 2017, and 10-2018-0079155, filed on Jul. 9, 2018, which are hereby incorporated by reference in their entirety.

TECHNICAL FIELD

The present invention relates to an apparatus and method for inspecting defects of a secondary battery.

BACKGROUND ART

Secondary batteries are rechargeable unlike primarily batteries, and also, the possibility of compact size and high capacity is high. Thus, recently, many studies on secondary batteries are being carried out. As technology development and demands for mobile devices increase, the demands for secondary batteries as energy sources are rapidly increasing.

Secondary batteries are classified into coin type batteries, cylindrical type batteries, prismatic type batteries, and pouch type batteries according to a shape of a pouch. In such a secondary battery, an electrode assembly mounted in a pouch is a chargeable and dischargeable power generating device having a structure in which an electrode and a separator are stacked.

The electrode assembly may be approximately classified into a jelly-roll type electrode assembly in which a separator is interposed between a positive electrode and a negative electrode, each of which is provided as the form of a sheet coated with an active material, and then, the positive electrode, the separator, and the negative electrode are wound, a stacked type electrode assembly in which a plurality of positive and negative electrodes with a separator therebetween are sequentially stacked, and a stack/folding type electrode assembly in which stacked type unit cells are wound together with a separation film having a long length.

In such an electrode assembly, a separator electrically insulates a positive electrode from a negative electrode to prevent internal short-circuit from occurring.

However, the separator may be torn, damaged, or folded during a process of manufacturing an electrode or a secondary battery comprising the electrode assembly to locally cause contact between electrodes. Here, low voltage failure, ignition, and explosion may occur due to the contact between the electrodes.

However, when defects of the electrode assembly according to the related art are inspected, it is difficult to precisely detect a locally contacted portion between the electrodes.

DISCLOSURE OF THE INVENTION

Technical Problem

One aspect of the present invention is to provide an apparatus and method for inspecting defects of a secondary battery, which are capable of inspecting existence and nonexistence of defects with respect to an electrode assembly of the secondary battery.

Also, another aspect of the present invention is to provide an apparatus and method for inspecting defects of a secondary battery, which are capable of inspecting existence and nonexistence of short circuit of an electrode due to damage of a separator of an electrode assembly.

Technical Solution

An apparatus for inspecting defects of a secondary battery according to an embodiment of the present invention comprises a pair of pressing jigs which press an outer surface of an electrode assembly or a pouch accommodating the electrode assembly in directions towards each other and on which a plurality of protrusions protrude from pressing surfaces of the pair of pressing jigs and a measurement unit measuring one or more of current, a voltage, and resistance of the electrode assembly when the electrode assembly is pressed by the plurality of protrusions of the pair of pressing jigs.

A method for inspecting defects of a secondary battery according to an embodiment of the present invention comprises a pressing step of pressing an outer surface of an electrode assembly or a pouch accommodating the electrode assembly through a pair of pressing jigs on which a plurality of protrusions protrude from pressing surfaces in directions towards each other and a measurement step of measuring one or more of current, a voltage, and resistance of the electrode assembly through a measurement unit when the electrode assembly is pressed by the plurality of protrusions through the pressing step.

Advantageous Effects

According to the present invention, the current, the voltage, or the resistance of the electrode assembly may be measured while pressing the electrode assembly through the pair of pressing jigs to inspect the existence and nonexistence of the defects of the electrode assembly.

Also, according to the present invention, the plurality of protrusions may protrude from the pressing surfaces of the pair of pressing jigs. Thus, the current, the voltage, or the resistance of the electrode assembly may be measured while the plurality of protrusions press the outer surface of the electrode assembly to precisely detect the existence and nonexistence of the short circuit of the electrode due to the damage of the separator. Particularly, the electrode assembly may be pressed through the plurality of protrusions to detect the internal short circuit at the local portion.

MODE FOR CARRYING OUT THE INVENTION

Figure 1:
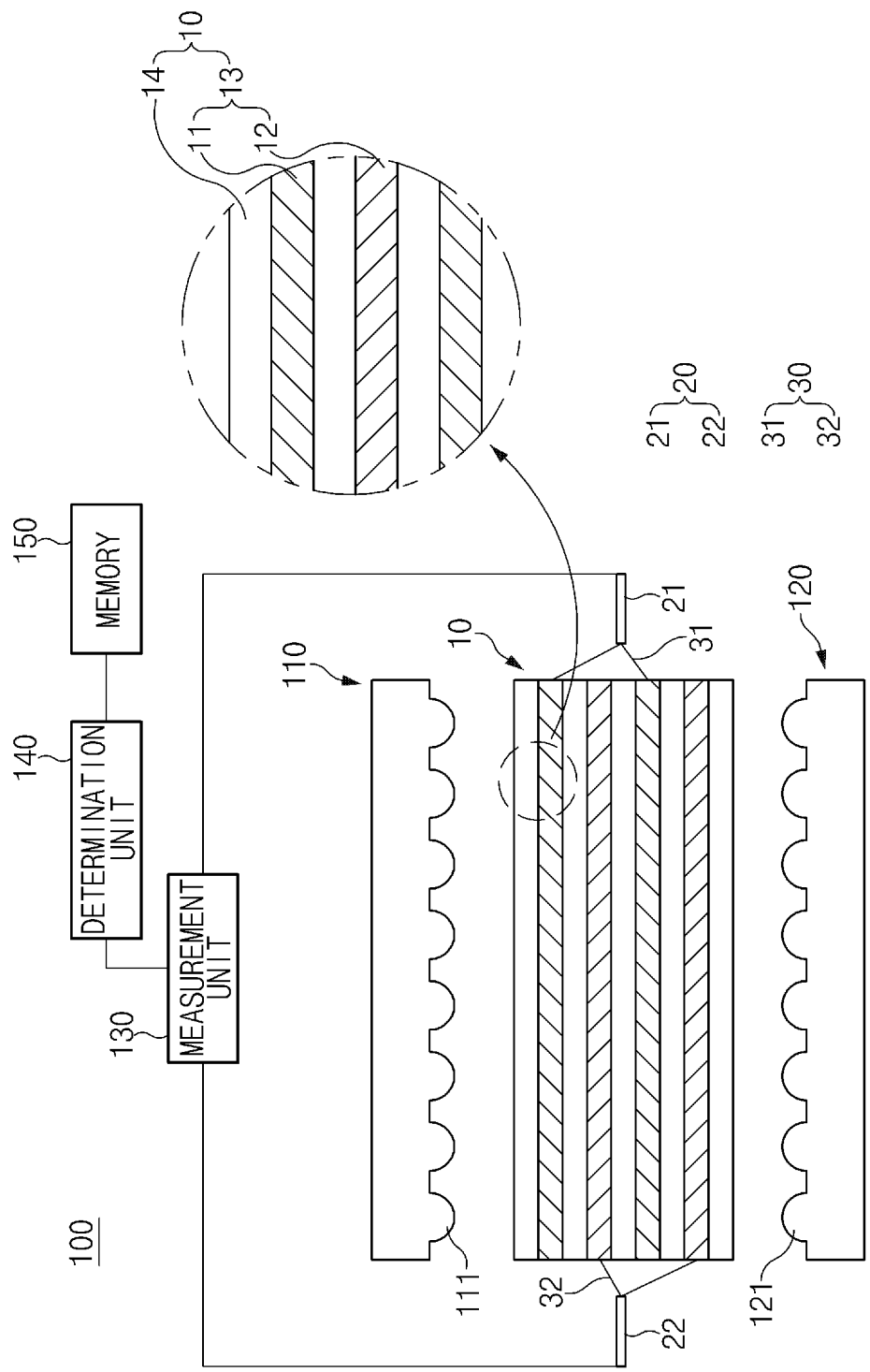
FIG. 1 is a conceptual cross-sectional view of an apparatus for inspecting defects of a secondary battery according to an embodiment of the present invention.

The objectives, specific advantages, and novel features of the present invention will become more apparent from the following detailed description taken in conjunction with the accompanying drawings. It should be noted that the reference numerals are added to the components of the drawings in the present specification with the same numerals as possible, even if they are illustrated in other drawings. Also, the present invention may be embodied in different forms and should not be construed as limited to the embodiments set forth herein. In the following description of the present invention, the detailed descriptions of related arts which may unnecessarily obscure the gist of the present invention will be omitted.

FIG. 1 is a conceptual cross-sectional view of an apparatus for inspecting defects of a secondary battery according to an embodiment of the present invention.

Referring to FIG. 1, an apparatus 100 for inspecting defects of a secondary battery according to an embodiment of the present invention comprises a pair of pressing jigs 110 and 120 pressing an electrode assembly 10 or a pouch accommodating the electrode assembly 10 and a measurement unit 130 measuring one or more of current, a voltage, and resistance of the pressed electrode assembly 10.

Also, the apparatus 100 for inspecting defects of the secondary battery according to an embodiment of the present invention may further comprise a determination unit 140 determining whether the electrode assembly 10 is defective and a memory in which standard values with respect to the current, the voltage, and the resistance of the electrode assembly 10 are stored.

Figure 2:
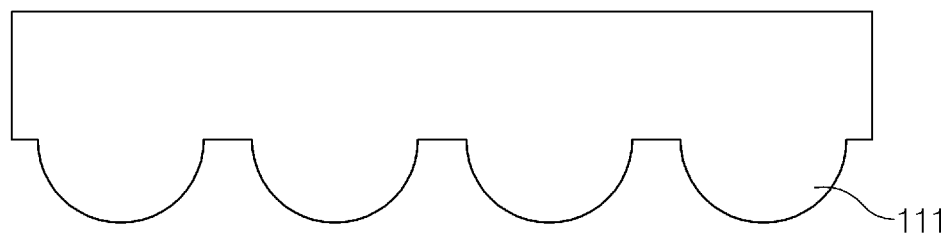
FIG. 2 is a cross-sectional view illustrating an example of a pressing jig in the apparatus for inspecting defects of the secondary battery according to an embodiment of the present invention.
Figure 3:
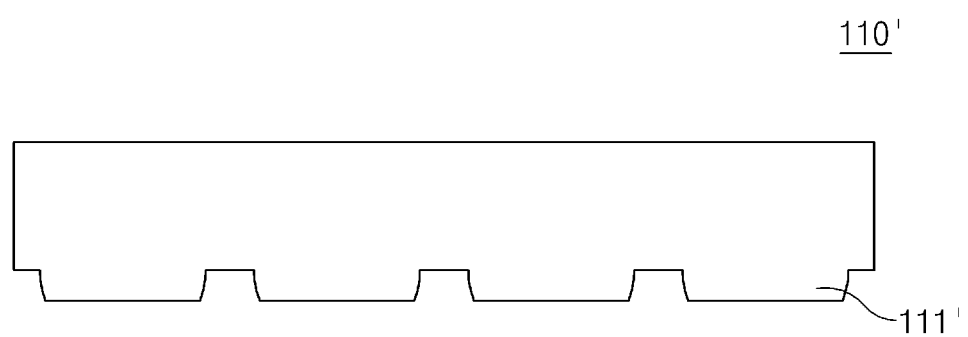
FIG. 3 is a cross-sectional view illustrating another example of the pressing jig in the apparatus for inspecting defects of the secondary battery according to an embodiment of the present invention.
Figure 4:
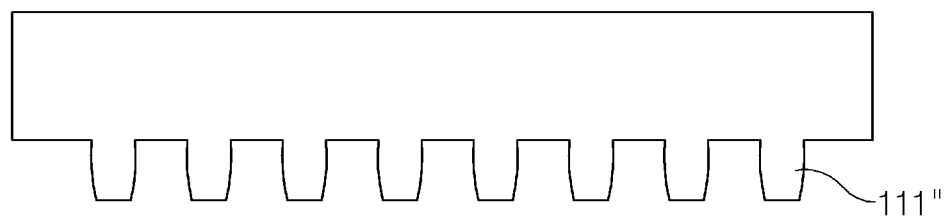
FIG. 4 is a cross-sectional view illustrating further another example of the pressing jig in the apparatus for inspecting defects of the secondary battery according to an embodiment of the present invention.

FIG. 2 is a cross-sectional view illustrating an example of the pressing jig in the apparatus for inspecting defects of the secondary battery according to an embodiment of the present invention, FIG. 3 is a cross-sectional view illustrating another example of the pressing jig in the apparatus for inspecting defects of the secondary battery according to an embodiment of the present invention, and FIG. 4 is a cross-sectional view illustrating further another example of the pressing jig in the apparatus for inspecting defects of the secondary battery according to an embodiment of the present invention.

Hereinafter, the apparatus for inspecting defects of the secondary battery according to an embodiment of the present invention will be described in more detail with reference to FIGS. 1 to 6.

Referring to FIG. 1, the electrode assembly 10 that is tested through the apparatus for inspecting defects of the secondary battery may be a chargeable and dischargeable power generation element and, for example, have a structure in which an electrode 13 and a separator 14 are combined with each other and stacked.

The electrode 13 may comprise a positive electrode 11 and a negative electrode 12. Here, the electrode assembly 10 may have a structure in which the positive electrode 11/the separator 14/the negative electrode 12 are alternately stacked. Here, the separator 14 may be disposed between the positive electrode 11 and the negative electrode 12 and disposed outside the positive electrode 11 and outside the negative electrode 12. Here, the separator 14 may be disposed to surround the entire electrode assembly 10 in which the positive electrode 11/the separator 14/the negative electrode 12 are stacked.

The separator 14 is made of an insulation material to electrically insulate the positive electrode 11 from the negative electrode 12. Here, the separator 14 may be made of, for example, a polyolefin-based resin film such as polyethylene or polypropylene having micropores.

The secondary battery may further comprise an electrode lead 20 electrically connected to the electrode 13.

The electrode lead 20 may comprise a positive electrode lead 21 connected to the positive electrode 11 and a negative electrode lead 22 connected to the negative electrode 12.

Also, the electrode lead 20 may be connected to the electrode 13 by being connected to an electrode tab 30, which is attached to the electrode 13 to protrude. Here, the positive electrode lead 21 may be connected to a positive electrode tab 31, and the negative electrode lead 22 may be connected to a negative electrode tab 32.

The pressing jigs 110 and 120 may be provided in a pair to press an outer surface of the electrode assembly 10 or the pouch accommodating the electrode assembly 10 in directions corresponding to each other. That is, the pair of pressing jigs 110 and 120 may move in direction facing each other to press both surfaces of the electrode assembly 10 or the pouch.

Also, a plurality of protrusions 111 and 121 may protrude from pressing surfaces of the pressing jigs 110 and 120. Here, the plurality of protrusions 111 and 121 may be disposed on facing surfaces of the pair of pressing jigs 110 and 120 to extend and protrude in directions facing each other.

Each of the protrusions 111 and 121 may be made of a metal material or a plastic material. Here, each of the protrusions 111 and 121 may be made of, for example, a plastic foam material.

Referring to FIG. 2, for example, each of the protrusions 111 and 121 of the pressing jig 110 may have a rounded end. Here, each of the protrusions 111 and 121 may have a hemispherical shape.

Referring to FIG. 3, for another example, a protrusion 111' of a pressing jig 110' may have a rectangular pillar shape having a width greater than a protruding length thereof. Here, the protrusion 111' may have a width that gradually decreases toward a distal end thereof.

Furthermore, referring to FIG. 4, for further another example, a protrusion 111" of a pressing jig 110" may have a rectangular pillar shape having a protruding length greater than a width thereof. Here, the protrusion 111" may have a tapered end that gradually decreases in width toward a distal end thereof.

Referring to FIG. 1, the determination unit 140 may receive values measured through the measurement unit 130 to determine whether the electrode assembly 10 is defective.

The memory 150 may store the standard values with respect to the current, the voltage, and the resistance of the electrode assembly 10.

Thus, the determination unit 140 may compare the standard values with respect to the current, the voltage, and the resistance of the electrode assembly 10, which are stored in the memory 150, to the measured values of the current, the voltage, and the resistance of the electrode assembly 10, which are measured through the measurement unit 130 to determine whether the electrode assembly 10 is defective. Here, for example, if the measured values measured through the measurement unit 130 are out of a range of the standard values stored in the memory 150, the determination unit 140 may determine that the electrode assembly 10 is defective.

Figure 5:
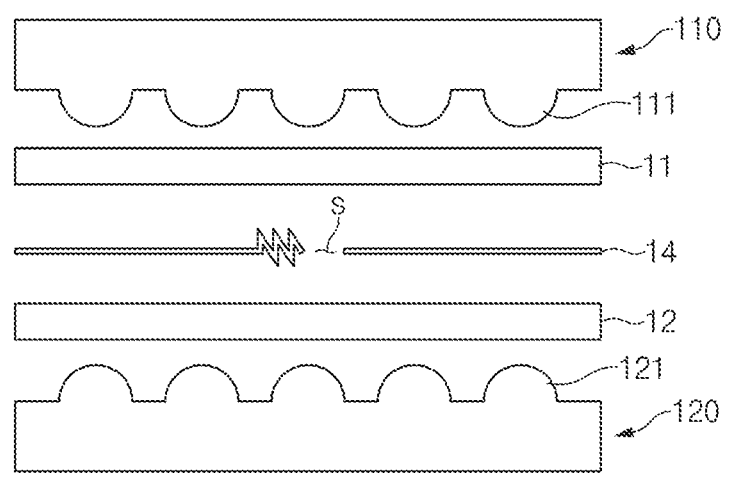
FIG. 5 is a cross-sectional view illustrating a state before being pressed through the pressing jig in the apparatus for inspecting defects of the secondary battery according to an embodiment of the present invention.
Figure 6:
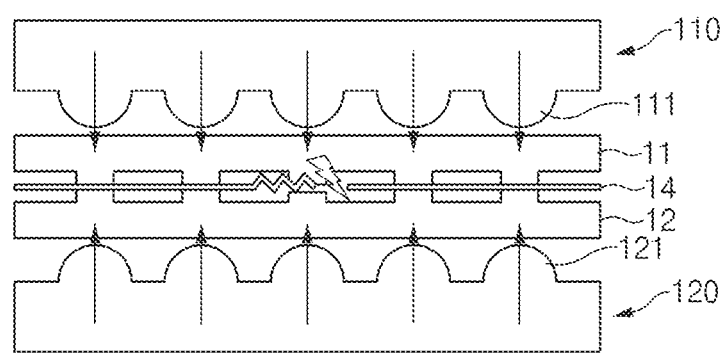
FIG. 6 is a cross-sectional view illustrating a state being pressed through the pressing jig in the apparatus for inspecting defects of the secondary battery according to an embodiment of the present invention.

FIG. 5 is a cross-sectional view illustrating a state before being pressed through the pressing jig in the apparatus for inspecting defects of the secondary battery according to an embodiment of the present invention, and FIG. 6 is a cross-sectional view illustrating a state being pressed through the pressing jig in the apparatus for inspecting defects of the secondary battery according to an embodiment of the present invention.

Referring to FIGS. 1, 5, and 6, if the separator 14 is torn to generate a damaged portion S during a process of manufacturing the secondary battery, when the pair of pressing jigs 110 and 120 are pressed to allow the protrusion 111 and 121 to press the torn damaged portion S of the separator 14, the positive electrode 11 and the negative electrode 12 may contact each other to cause short circuit. Thus, the measurement unit 130 may detect that the measured values are out of the range of the standard values due to the short circuit of the electrode by measuring the current, the voltage, and the resistance of the electrode assembly 10.

That is, internal short circuit at a local portion, which is not detected when the entire outer surface of the electrode assembly or the pouch is pressed, may be precisely detected by pressing the electrode assembly or the pouch by using the plurality of protrusions 111 and 121.

Figure 7:
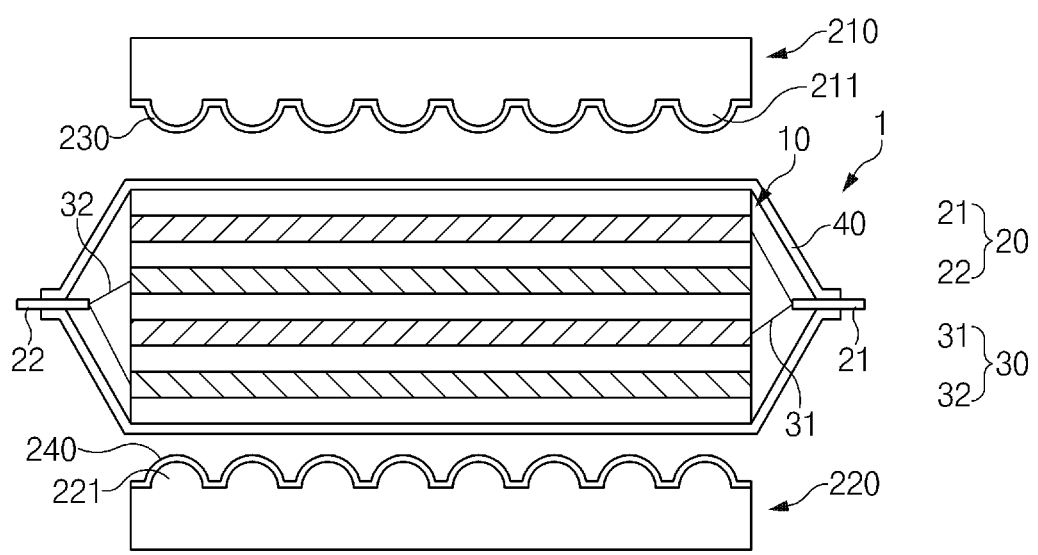
FIG. 7 is conceptual cross-sectional view of an apparatus for inspecting defects of a secondary battery according to another embodiment of the present invention.

FIG. 7 is a conceptual cross-sectional view of an apparatus for inspecting defects of a secondary battery according to another embodiment of the present invention.

Referring to FIG. 7, an apparatus 200 for inspecting defects of a secondary battery according to another embodiment of the present invention is different from the apparatus 100 for inspecting defects of the secondary battery according to the foregoing embodiment of the present invention in that flexible layers 230 and 240 are further provided on pressing jigs 210 and 220. Thus, contents of this embodiment, which are duplicated with those according to the forgoing embodiment, will be briefly described, and also, differences therebetween will be mainly described.

In the apparatus 200 for inspecting defects of the secondary battery according to another embodiment of the present invention, the pair of pressing jigs 210 and 220 are provided with the flexible layers 230 and 240.

The flexible layers 230 and 240 may be disposed on surfaces facing each other of the pair of pressing jigs 210 and 220. Here, the flexible layers 230 and 240 may comprise outer surfaces of protrusions 211 and 221 disposed on pressing surfaces of the pressing jigs 210 and 220.

Also, each of the flexible layers 230 and 240 may be made of a material having flexibility and an insulation material. Here, each of the flexible layers 230 and 240 may be made of, for example, a polymer material.

Thus, for example, when the electrode assembly 10 is pressed through the pair of pressing jigs 210 and 220, the flexible layers 230 and 240 may be disposed on the outer surfaces of the protrusions 211 and 221 to prevent the electrode assembly 10 from being damaged by the protrusions 211 and 221 of the pressing jigs 210 and 220. Also, for another example, when a secondary battery 1 comprising the electrode assembly 10 and the pouch 40 accommodating the electrode assembly 10 is pressed through the pair of pressing jigs 210 and 220, the flexible layers 230 and 240 may be disposed on the pressing surfaces of the pressing jigs 210 and 220 to prevent safety from being deteriorated due to the damage of the pouch 40 and the electrode assembly 10.

Figure 8:
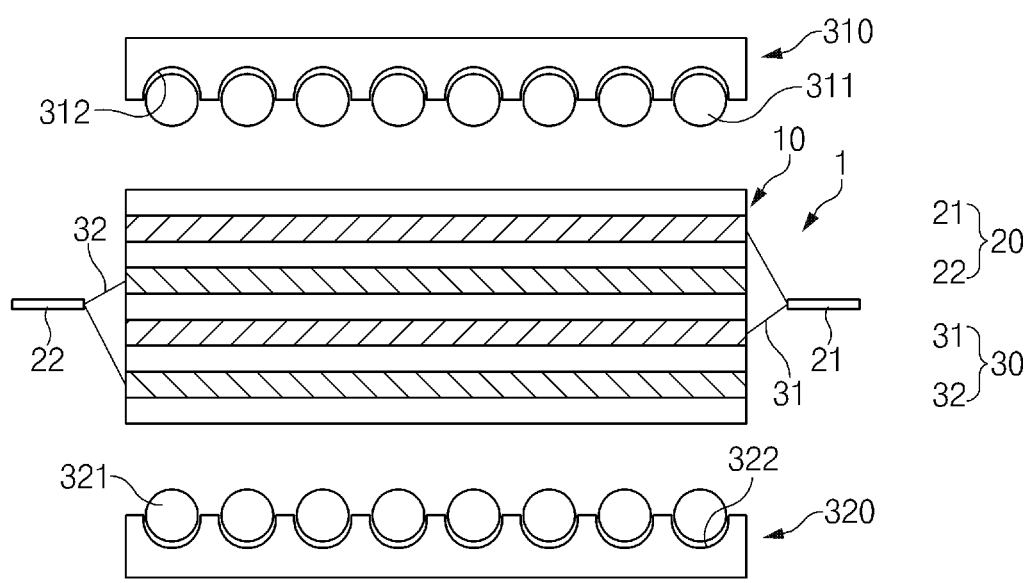
FIG. 8 is conceptual cross-sectional view of an apparatus for inspecting defects of a secondary battery according to further another embodiment of the present invention.
Figure 9:
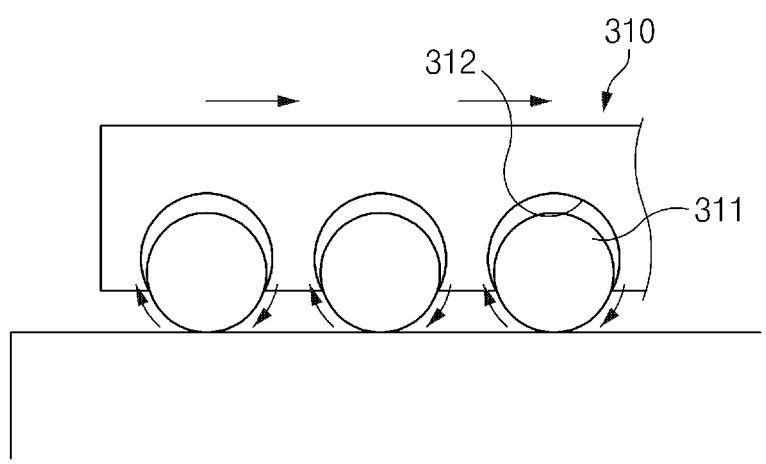
FIG. 9 is a cross-sectional view of a pressing jig in the apparatus for inspecting defects of the secondary battery according to further another embodiment of the present invention.
Figure 10:
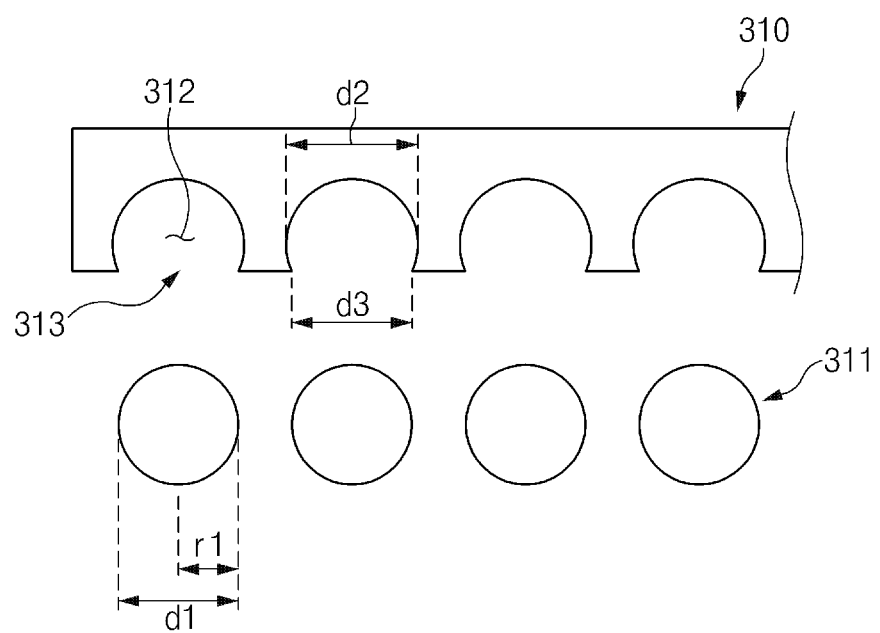
FIG. 10 is an exploded cross-sectional view of the pressing jig in the apparatus for inspecting defects of the secondary battery according to further another embodiment of the present invention.

FIG. 8 is a conceptual cross-sectional view of an apparatus for inspecting defects of a secondary battery according to further another embodiment of the present invention, FIG. 9 is a cross-sectional view of a pressing jig in the apparatus for inspecting defects of the secondary battery according to further another embodiment of the present invention, and FIG. 10 is an exploded cross-sectional view of the pressing jig in the apparatus for inspecting defects of the secondary battery according to further another embodiment of the present invention.

Referring to FIG. 8, an apparatus 300 for inspecting defects of a secondary battery according to further another embodiment of the present invention is different from the apparatus 100 for inspecting defects of the secondary battery according to the foregoing embodiment and the apparatus 200 for inspecting defects of the secondary battery according to another embodiment in that protrusions 311 and 321 are rotatably provided on pressing jigs 310 and 320. Thus, contents of this embodiment, which are duplicated with those according to the foregoing embodiments, will be briefly described, and also, differences therebetween will be mainly described.

Referring to FIGS. 8 and 9, in the apparatus 300 for inspecting defects of the secondary battery according to further another embodiment of the present invention, each of the protrusions 311 and 321 of the pair of pressing jigs 310 and 320 may have a spherical shape, and mounting grooves 312 and 322 in which the protrusions 311 and 321 are mounted may be formed in the pressing jigs 310 and 320. Here, the mounting grooves 312 and 322 may be formed in pressing sides of the pressing jigs 310 and 320.

Also, referring to FIGS. 9 and 10, the mounting grooves 312 and 322 may be formed so that one side of each of the protrusions 311 and 321 protrude to the outside of each of the mounting grooves 312 and 322.

Here, each of the mounting grooves 312 and 322 may have a depth greater than a radius r1 and less than a diameter d1 of each of the protrusions 311 and 321 so that a portion of each of the protrusions 311 and 321 protrudes to the outside of each of the mounting grooves 312 and 322.

Here, an inlet hole 313 through which a portion of each of the protrusions 311 and 321 protrudes may be formed in an inlet of each of the mounting grooves 312 and 322. The inlet hole 313 of each of the mounting grooves 312 and 322 may have a diameter d3 less than the diameter d1 of each of the protrusions 311 and 321 to prevent the protrusions 311 and 321 from being separated from the mounting grooves 312 and 322.

For example, each of the mounting grooves 312 and 322 may have a diameter d2 equal to or greater than the diameter d1 of each of the protrusions 311 and 321.

Furthermore, each of the mounting grooves 312 and 322 may have a shape corresponding to each of the protrusions 311 and 321.

Thus, each of the protrusions 311 and 321 may have a spherical shape, and each of the mounting grooves 312 and 322 may have a shape corresponding to each of the protrusions 311 and 321. As a result, when the protrusions 311 and 321 move in one direction along surfaces to be pressed by pressing portions to be pressed, the protrusions 311 and 321 may rotate to allow the pressing jigs 310 and 320 to move. Thus, the portions to be pressed may be prevented from being damaged by the protrusions 311 and 321. That is, the outer surface of the electrode assembly 10 or the pouch, which is pressed by the protrusions 311 and 321, may be prevented from being damaged.

Also, each of the protrusions 311 and 321 may have, for example, a diameter of 0.2 mm to 30 mm. Furthermore, each of the protrusions 311 and 321 may have, particularly, a diameter of 0.5 mm to 10 mm. Here, since the protrusion has the diameter of 10 mm or less, accurate measurement may be enabled. Also, since the protrusion has the diameter of 0.5 mm or more, the electrode assembly 10 or the pouch may be prevented from being damaged when being pressed. Here, if a pressing area pressed by the protrusion is narrow, pressing force applied per unit area may increase to damage the electrode assembly 10 or the pouch.

Figure 11:
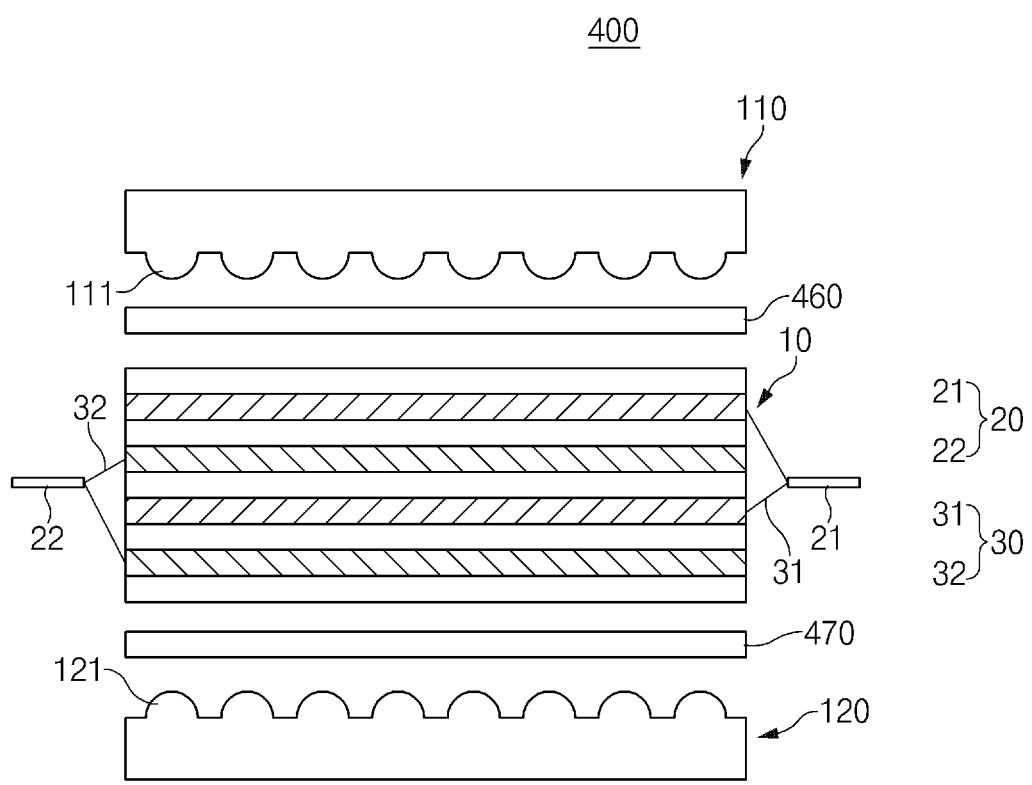
FIG. 11 is a cross-sectional view of the apparatus for inspecting defects of the secondary battery, which is applied to a method for inspecting defects of the secondary battery according to an embodiment of the present invention.

FIG. 11 is a cross-sectional view of the apparatus for inspecting defects of the secondary battery, which is applied to a method for inspecting defects of the secondary battery according to an embodiment of the present invention.

Referring to FIG. 11, the method for inspecting defects of the secondary battery according to an embodiment of the present invention comprises a pressing step of pressing an electrode assembly 10 or a pouch accommodating the electrode assembly 10 through a pair of pressing jigs 110 and 120 of an apparatus 400 for inspecting defects and a measurement step of measuring one or more of current, a voltage, and resistance of the pressed electrode assembly 10.

Also, the method for inspecting defects of the secondary battery according to an embodiment of the present invention may further comprise a determination step of determining whether electrode assembly 10 is defective.

Figure 12:
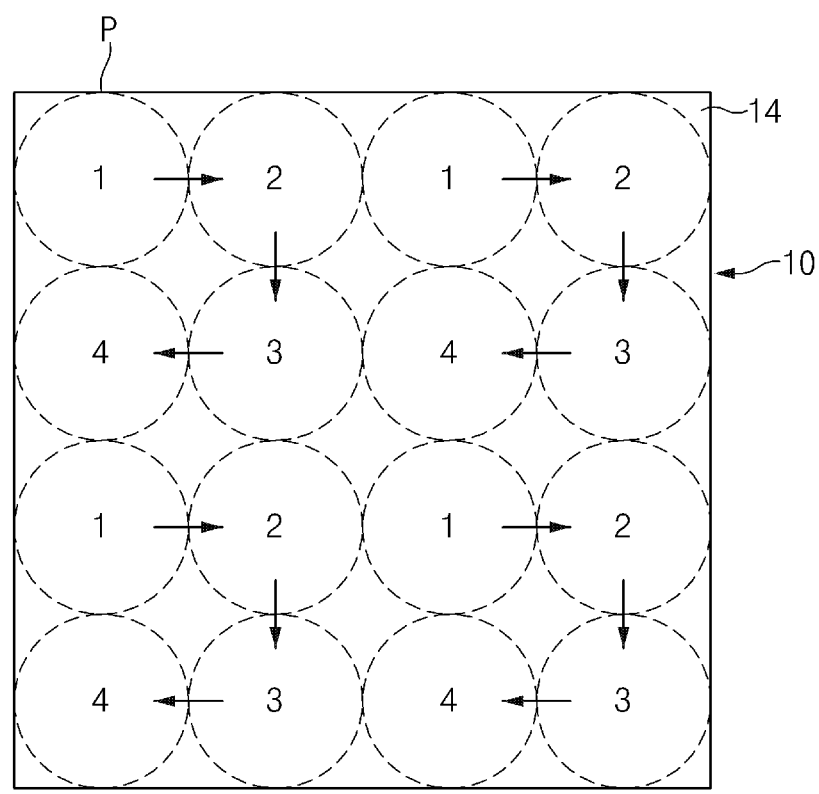
FIG. 12 is a conceptual view illustrating a pressing method of a pressing step in the method for inspecting defects of the secondary battery according to an embodiment of the present invention.

FIG. 12 is a conceptual view illustrating a pressing method of the pressing step in the method for inspecting defects of the secondary battery according to an embodiment of the present invention.

Hereinafter, the method for inspecting defects of the secondary battery according to an embodiment of the present invention will be described in more detail with reference to FIGS. 11 and 12.

Referring to FIG. 11, in the pressing step, an outer surface of the electrode assembly 10 or the pouch accommodating the electrode assembly 10 are pressed in directions corresponding to each other through the pair of pressing jigs 110 and 120 on which a plurality of protrusions 111 and 121 protrude from pressing surfaces.

Also, in the pressing step, for example, the outer surface of the electrode assembly 10 or the pouch may be pressed at a pressure of 1 $kg/cm^2$ to 5,000 $kg/cm^2$ through the pair of pressing jigs 110 and 120. Here, in the pressing step, the outer surface of the electrode assembly 10 or the pouch may be pressed at a pressure of 10 $kg/cm^2$ to 1,000 $kg/cm^2$ through the pair of pressing jigs 110 and 120.

When the outer surface of the electrode assembly 10 or the pouch is pressed at a pressure of 10 $kg/cm^2$ or more, pressing force that is required for causing short circuit may be secured to more facilitate the measurement. That is, when pressed at a pressure of 10 $kg/cm^2$ or more, the pressing force required for allowing a positive electrode 11 to contact a negative electrode 12 may reach a damaged portion S of a separator 14 to easily cause the short circuit. Thus, the damaged portion S of the separator 140 may be detected (see FIG. 6).

Also, when the outer surface of the electrode assembly 10 or the pouch is pressed at a pressure of 1,000 $kg/cm^2$ or less, the electrode assembly 10 or the pouch may be prevented from being damaged or broken.

In addition, in the pressing step, flexible films 460 and 470 made of a material having flexibility may be disposed between the pressing jigs 110 and 120 and the electrode assembly 10 or the pouch, and then, the electrode assembly 10 or the pouch may be pressed. Thus, since the flexible films 460 and 470 are disposed between the pressing jigs 110 and 120 and the pressed portions, the outer surface of the electrode assembly 10 or the pouch may be prevented from being damaged by the protrusions 111 and 121 of the pressing jigs 110 and 120. Here, each of the flexible films 460 and 470 may be made of a polymer material.

In the pressing step, for example, the pair of pressing jigs 110 and 120 may repeatedly move upward and downward to press the electrode assembly 10 or the pouch.

Referring to FIG. 12, in the pressing step, for another example, each of the pair of pressing jigs 110 and 120 move along a predetermined path to press the electrode assembly 10. Here, in the pressing step, for example, a portion 1 of the outer surface of the electrode assembly 10 may be pressed through the upward and downward movement of the pair of pressing jigs 110 and 120, and a portion 2 of the outer surface of the electrode assembly 10 may be pressed through horizontal movement of the pair of pressing jigs 110 and 120. Thereafter, a portion 3 of the outer surface of the electrode assembly 10, which is disposed in a diagonal direction with respect to the portion 1, may be pressed through the pair of pressing jigs 110 and 120, and then, the pair of pressing jigs 110 and 120 may horizontally move in the other direction to press a portion 4, which is disposed in a diagonal direction with respect to the portion 32. Here, the pair of pressing jigs 110 and 120 may move along the predetermined path to allow the protrusions 111 and 121 to contact an entire outer surface of the separator 14 disposed on the outside of the electrode assembly 10, thereby pressing the electrode assembly 10. That is, most area of the outer surface of the separator 14 may be occupied by a pressing area P that is pressed by the protrusions 111 and 121.

Referring to FIG. 11, in the measurement step, when the electrode assembly 10 is pressed by the protrusions 111 and 121 through the pressing step, one or more of current, a voltage, and resistance of the electrode assembly 10 may be measured through the measurement unit 130.

In the determination step, standard values with respect to the current, the voltage, and the resistance of the electrode assembly 10, which are stored in the memory 150, may be compared to values measured through the measurement step to determine whether the electrode assembly 10 is defective.

In the determination step, one side of the measurement unit 130 may be connected to a positive electrode lead 21, and the other side may be connected to a negative electrode lead 22 to measure the resistance value, thereby determining whether the electrode assembly 10 is defective. Here, when the resistance value is low, the determination unit 140 may determine that the electrode 13 contacts the damaged portion of the separator 14 to allow current to flow, thereby determining that the electrode assembly 10 is defective due to the damage of the separator 14. That is, for example, in a lithium secondary battery, lithium ions may not move between the positive electrode 11 and the negative electrode when an electrolyte does not exist to electrically insulate the positive electrode 11 and the negative electrode 12 from each other by the separator 14. On the other hand, when the separator 14 is damaged, the positive electrode 11 and the negative electrode 12 may contact each other through the damaged portion to allow electricity to flow. As a result, the resistance value may be reduced, and the reduction in resistance may be detected in the determination step. Thus, it may be assumed that the electrode assembly 10 is defective (see FIG. 1).

Also, in the determination step, for another example, if it is difficult to precisely measure the resistance value at the short-circuited portion in a state in which the electrolyte is injected into the battery, whether the positive electrode 11 and the negative electrode 12 are short-circuited may be determined through measurement of the current at the time of constant-voltage charging or the voltage of the secondary battery. Here, the measurement unit 130 may be connected to an electrode lead 20 to measure the current or voltage of the secondary battery.

In more detail, when the current is measured in the determination step, a constant voltage value of the secondary battery at an measurement time may be measured, and then, the constant voltage value may be applied as it is to the secondary battery, or a predetermined value may be added to or subtracted from the constant voltage value so as to be applied. Then, the damaged portion may be pressed to determine whether the electrode assembly is defective. Here, when the short circuit occurs at the damaged portion, and the voltage of the secondary battery is reduced, the constant-voltage charging may be performed for the applied voltage to match the voltage of the secondary battery. Here, whether the voltage of the battery is reduced due to the short circuit may be confirmed through a value of the flowing current. That is, the measurement unit 130 may measure the flowing current value, and if it is determined that the voltage of the secondary battery is reduce due to the short circuit, the determination unit 140 may determine that the secondary battery is defective. Also, in the determination step, the measurement and applying of the voltage through the measurement unit 130 may be performed at one or more of before pressing the secondary battery, when pressing the secondary battery, or after pressing the secondary battery.

Also, in the determination step, when the voltage is measured, the voltage value may be continuously measured without performing the constant-voltage charging to confirm whether the voltage is reduced due to the short circuit. Then, if the voltage is reduced when compared to a voltage of the secondary battery in the normal state during the pressing, it may be determined that the secondary battery is defective. That is, when the measurement unit 130 measures the voltage value of the secondary battery to determine that the measured voltage is significantly reduced when compared to that of the secondary battery in the normal state, the determination unit 140 may determine that the secondary battery is defective.

Embodiment 1

A pair of pressing jigs pressing an electrode assembly comprising an electrode and a separator and a measurement unit measuring a voltage of the electrode assembly during the pressing were provided to constitute an apparatus for inspecting defects of the secondary battery. Here, a protrusion was provided to protrude form a pressing surface of each of the pressing jig. Here, the protrusion was provided as a ball having a diameter of 2 mm.

Embodiment 2

An apparatus for inspecting defects of a secondary battery according to Embodiment 2 was constituted in the same configuration as that according to Embodiment 1 except that a protrusion of a pressing jig is provided as a ball having a diameter of 5 mm.

Comparative Example 1

An apparatus for inspecting defects of a secondary battery according to Comparative Example 1 was constituted in the same configuration as that according to each of Embodiments 1 and 2 except that a pressing surface of a pressing jig has a planar shape.

Comparative Example 2

An apparatus for inspecting defects of a secondary battery according to Comparative Example 2 was constituted in the same configuration as that according to each of Embodiments 1 and 2 except that a cylindrical rod is provided on a pressing surface of a pressing jig. Here, a cylindrical metal rod having a diameter of 6 mm and a length of 10 cm was used as the pressing jig.

Experimental Example 1

Figure 13:
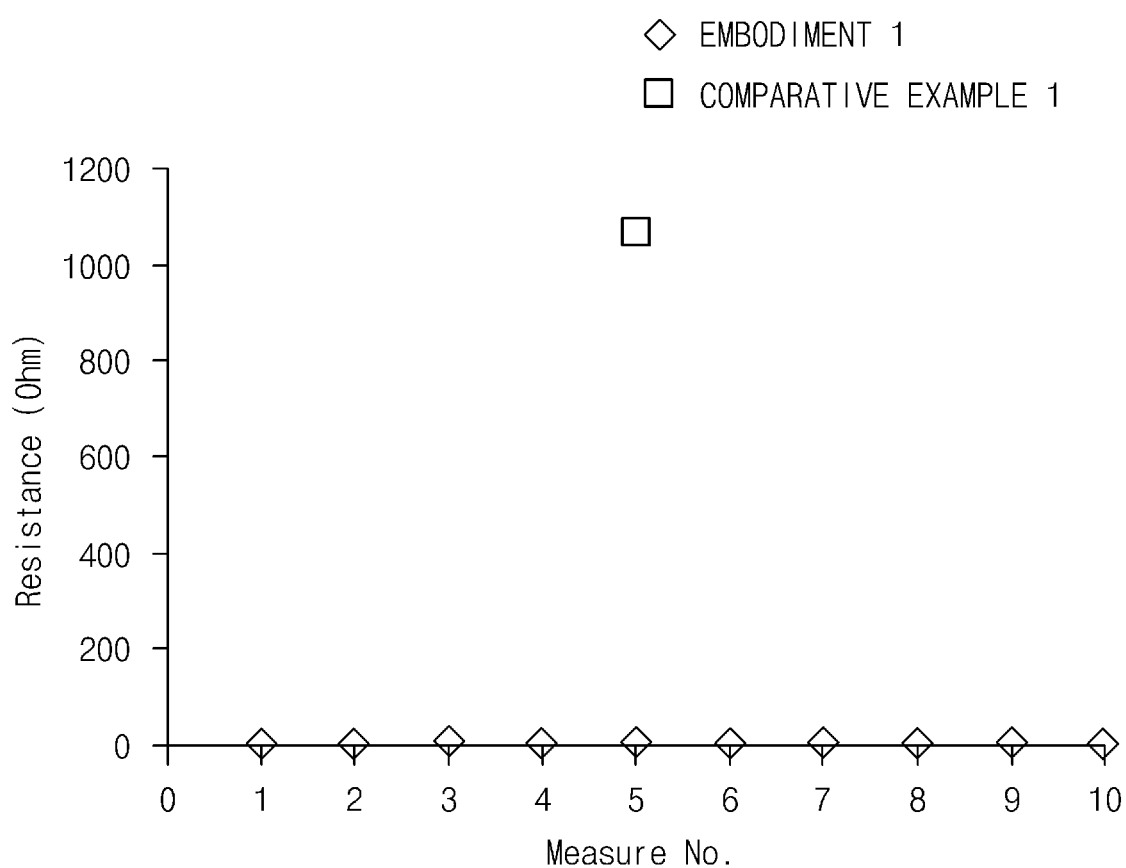
FIG. 13 is a graph illustrating results obtained by measuring resistance by pressing an electrode assembly through a pressing jig according to Embodiment 1 and a pressing jig according to Comparative Example 1.

Results obtained by inspecting torn defects of a separator by pressing an outer surface of an electrode assembly through a pressing jig were shown in Table 1 and also illustrated as a graph in FIG. 13.

The separator had a thickness of 20 um, and the torn portion had a size of 5×1 mm.

The pressing jig was provided to adjust torque wrench and pressed so that a torque value has 20 kgfcm. Here, a shaft to which pressing force is applied by the pressing jig was provided as a screw shaft to adjust the pressing force through the torque wrench.

A multimeter was used as a measurement unit to measure a resistance value. Also, after being pressed through the pressing jig, the resistance value was measured 10 times under the same conditions by using the multimeter within 2 seconds, and the measured results were recorded. Here, the resistance was measured by electrically connecting both sides of the multimeter to electrodes disposed on both sides of the torn separator. That is, one side of the multimeter was connected to the electrode disposed above the separator, and the other side of the multimeter was connected to the electrode disposed below the separator to measure the resistance.

TABLE 1

| Resistance value measurement order | Embodiment 1 (Unit ohm) | Comparative Example 1 (Unit ohm) |
|---|---|---|
| 1 | 0.216 | OF |
| 2 | 0.19 | OF |
| 3 | 5.557 | OF |
| 4 | 0.498 | OF |
| 5 | 5.134 | 1063 |
| 6 | 0.201 | OF |
| 7 | 0.285 | OF |
| 8 | 4.155 | OF |
| 9 | 3.271 | OF |
| 10 | 0.17 | OF |

As shown in Table 1 and the graph of FIG. 13, in a point pressing manner in which a protrusion protrudes from a pressing surface of a pressing jig according to Embodiment 1, a resistance value of 10 ohm or less was exhibited in all measurement orders. However, in a surface pressing manner in which a pressing surface of a pressing jig according to Comparative Example 1 is flat, all of the resistance values of overflow (over a measurement limit) were observed except that a resistance value near 1000 ohm is measured only once in the 10 times. That is, the resistance value of the overflow (over the measurement limit) indicates that short circuit is not detected. In Comparative Example 1, the resistance of the overflow (over the measurement limit) was shown at measurement orders 1 to 4 and orders 6 to 10, and the short circuit was not be detected. In more detail, current does not flow between an upper electrode and a lower electrode with a separator therebetween by insulation of the separator. Here, when being pressed upward and downward by the pair of pressing jigs, the upper electrode and the lower electrode may contact each other through a damaged portion of the separator to cause short circuit so that the current flows. Here, when the current flows, resistance may be reduced, and thus, the reduction of the resistance may be detected to determine that the short circuit occurs. Thus, in Embodiment 1, it is seen that all of the resistance values are measured during the 10 times of the measurement, and thus, the short circuit occurs at all of the 10 times of the resistance measurement through the damaged portion of the separator.

However, in Comparative Example 1, it is seen that all of the resistance values of overflow (over the measurement limit) are observed except for a resistance value (1,063 ohm) near 1000 ohm is measured only once (resistance value measurement order 5) in the 10 times of the measurement. That is, in the surface pressing manner according to Comparative Example 1, it is seen that only about 10% of the short circuit occurs through the damaged portion of the separator, and the apparatus for inspecting defects of the electrode assembly is remarkably deteriorated in reliability.

Experimental Example 2

Figure 14:
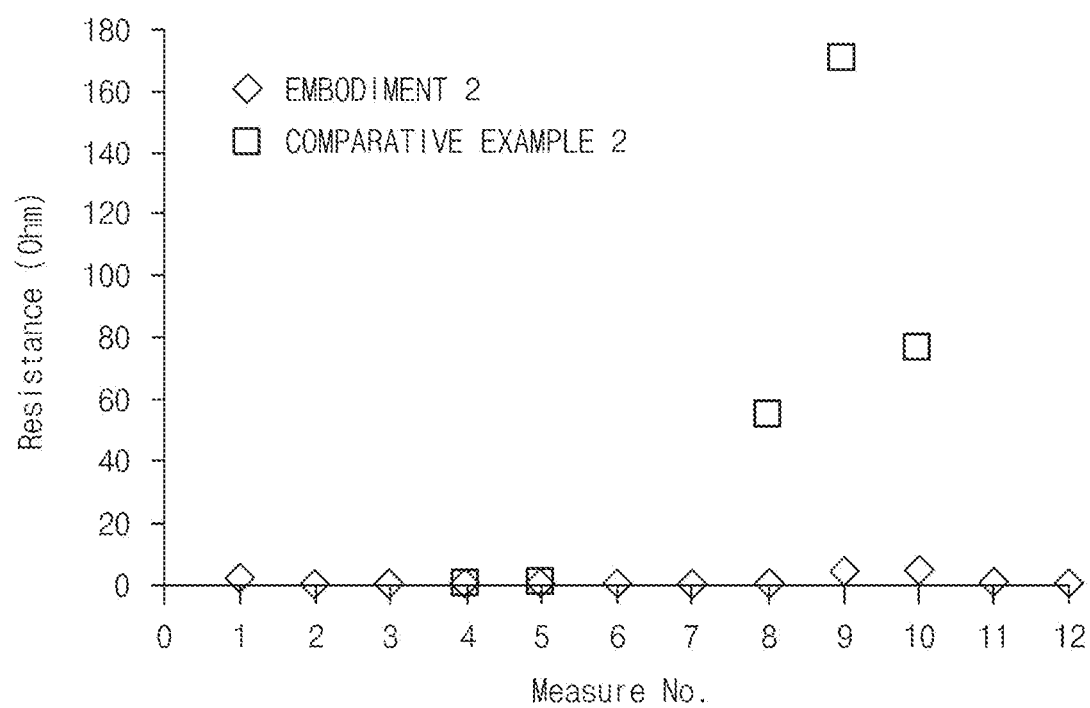
FIG. 14 is a graph illustrating results obtained by measuring resistance by pressing the electrode assembly through a pressing jig according to Embodiment 2 and pressing jigs according to Comparative Examples 1 and 2.

Results obtained by inspecting torn defects of a separator by pressing an outer surface of an electrode assembly through a pressing jig were illustrated as a graph in FIG. 14.

The separator had a thickness of 20 um, and the torn portion had a size of 20×1 mm.

The pressing jig was provided to adjust torque wrench and pressed so that a torque value has 4 kgfcm.

A multimeter was used as a measurement unit to measure a resistance value. Also, after being pressed through the pressing jig, the resistance value was measured 12 times under the same conditions by using the multimeter within 2 seconds, and the measured results were recorded. Here, the resistance was measured by electrically connecting both sides of the multimeter to electrodes disposed on both sides of the torn separator. That is, one side of the multimeter was connected to the electrode disposed above the separator, and the other side of the multimeter was connected to the electrode disposed below the separator to measure the resistance.

As illustrated in FIG. 14, in the surface pressing manner in which the pressing surface of the pressing jig according to Comparative Example 1 is flat, a resistance value overflow (over the measurement limit) was observed. In the graph of FIG. 14, a horizontal axis represents a measure order (No.), and a vertical axis represents a resistance value.

In Comparative Example 1, when the resistance value is measured, the resistance value of overflow (over measurement limit) was observed at orders 1 to 10, and the short circuit was not detected.

In Comparative Example 2, when the resistance value is measured, the resistance value was observed at orders 4, 5, 8, 9, and 10, and thus, the short circuit was detected. That is, in Comparative Example 2, it is seen that the short circuit occurs at orders 4, 5, 8, 9, and 10. However, in Comparative Example 2, the resistance value of overflow (over measurement limit) was observed at orders 1, 2, 3, 6, 7, 11, and 12, and thus, the short circuit did not occur. As a result, in a linear pressing manner in which a pressing part of the pressing jig is provided as a cylindrical rod to provide a pressing surface having a line shape, a detection rate was higher than that in the surface pressing manner, but a detection rate of the short circuit was a level of about 42%. That is, it is seen that the short circuit occurs at the level of about 42% in the linear pressing manner according to Comparative Example 2.

In the point pressing manner in which the protrusion protrudes from the pressing surface of the pressing jig according to Example 2, the resistance value was observed at all of the measurement orders 1 to 10, and thus, the detection rate of 100% of the short circuit was obtained, and superior detection performance was realized. As a result, in the point pressing manner according to Embodiment 2, it is seen that the short circuit occurs 100%.

Thus, as the results of the experiment, it is seen that the fine torn area of the separator is remarkably improved in the point pressing manner according to Embodiment 2 when compared to the surface pressing manner according to Comparative Example 1 or the linear pressing manner according to the Comparative Example 2.

While the present invention has been particularly shown and described with reference to exemplary embodiments thereof, it is to be understood that the scope of the present invention not limited to the apparatus and method for inspecting defects of the secondary battery according to the present invention. It will be understood by those of ordinary skill in the art that various changes in form and details may be made therein without departing from the spirit and scope of the invention.

Furthermore, the scope of protection of the present invention will be clarified by the appended claims.

The invention claimed is:

1. An apparatus for inspecting defects of a secondary battery, the apparatus comprising:
    a pair of pressing jigs which press an outer surface of an electrode assembly or a pouch accommodating the electrode assembly in directions towards each other and on which a plurality of protrusions protrude from pressing surfaces of the pair of pressing jigs; and
    a measurement unit measuring one or more of current, a voltage, and electrical resistance of the electrode assembly when the electrode assembly is pressed by the plurality of protrusions of the pair of pressing jigs,
    wherein the pair of pressing jigs move toward one another and is capable of applying a varying amount of pressure,
    wherein each of the protrusions has a spherical shape,
    wherein each of the pressing jigs has a mounting groove in which a corresponding one of each of the protrusion is mounted,
    wherein the corresponding protrusion is mounted in the mounting groove so that a portion of the corresponding protrusion protrudes to the outside of the mounting groove, and
    wherein an inlet hole of each mounting groove has a diameter less than a diameter of the corresponding protrusion to prevent the corresponding protrusion from being separated from the mounting groove.

2. The apparatus of claim 1, further comprising a determination unit receiving the values measured through the measurement unit to determine whether the electrode assembly is defective.

3. The apparatus of claim 2, further comprising a memory in which standard values with respect to the current, the voltage, and the resistance of the electrode assembly are stored,
    wherein the determination unit compares the standard values stored in the memory to the values measured through the measurement unit to determine whether the electrode assembly is defective.

4. The apparatus of claim 1, wherein each of the protrusions is made of a metal material or a plastic foam material.

5. The apparatus of claim 1, wherein each mounting groove has a shape corresponding to the corresponding protrusion.

6. The apparatus of claim 1, wherein each mounting groove has a depth greater than a radius and less than a diameter of the corresponding protrusion so that a portion of the corresponding protrusion protrudes to the outside of the mounting groove.

7. The apparatus of claim 1, wherein each of the pressing jig further comprises a flexible layer made of a material having flexibility on the pressing surface thereof.

8. The apparatus of claim 1, wherein each of the protrusions is rotatably retained in the pair of pressing jigs.

9. The apparatus of claim 1, wherein the plurality of protrusions are attached to and move with the respective pressing jig.

10. A method for inspecting defects of a secondary battery, the method comprising:
    a pressing step of pressing an outer surface of an electrode assembly or a pouch accommodating the electrode assembly through a pair of pressing jigs on which a plurality of protrusions protrude from pressing surfaces in directions towards each other by moving the pair of pressing jigs toward one another to apply a varying amount of pressure; and
    a measurement step of measuring one or more of current, a voltage, and electrical resistance of the electrode assembly through a measurement unit when the electrode assembly is pressed by the plurality of protrusions through the pressing step,
    wherein each of the protrusions has a spherical shape,
    wherein each of the pressing jigs has a mounting groove in which a corresponding one of each of the protrusion is mounted,
    wherein the corresponding protrusion is mounted in the mounting groove so that a portion of the corresponding protrusion protrudes to the outside of the mounting groove, and
    wherein an inlet hole of each mounting groove has a diameter less than a diameter of the corresponding protrusion to prevent the corresponding protrusion from being separated from the mounting groove.

11. The method of claim 10, further comprising a determination step in which a determination unit receives values measured through the measurement step to determine whether the electrode assembly is defective.

12. The method of claim 11, wherein, in the determination step, standard values with respect to the current, the voltage, and the resistance of the electrode assembly, which are stored in a memory and the values measured through the measurement step are compared to each other to determine whether the electrode assembly is defective.

13. The method of claim 10, wherein, in the pressing step, the pair of pressing jigs repeatedly move upward and downward to press the electrode assembly or the pouch or move along a predetermined path to press the electrode assembly or the pouch.

14. The method of claim 10, wherein, in the pressing step, after a flexible film made of a material having flexibility is provided between the pressing jigs and the electrode assembly or the pouch, the electrode assembly or the pouch is pressed.

* * * * *